United States Patent [19]

Hosokawa et al.

[11] Patent Number: 5,705,284
[45] Date of Patent: Jan. 6, 1998

[54] THIN FILM ELECTROLUMINESCENCE DEVICE

[75] Inventors: Chishio Hosokawa; Hisahiro Higashi; Tadashi Kusumoto, all of Sodegaura-machi, Japan

[73] Assignee: Idemitsu Kosan Co., Ltd., Tokyo, Japan

[21] Appl. No.: 451,533

[22] Filed: May 26, 1995

Related U.S. Application Data

[62] Division of Ser. No. 669,754, Mar. 15, 1991, Pat. No. 5,443,921.

[30] Foreign Application Priority Data

Mar. 26, 1990 [JP] Japan ................. 2-073484

[51] Int. Cl.$^6$ ........................... H05B 33/14
[52] U.S. Cl. .................. 428/690; 428/691; 428/917; 313/502; 313/503; 313/504; 313/506; 313/507; 313/509; 313/498; 427/66; 427/69; 427/70
[58] Field of Search ................... 428/690, 691, 428/917; 213/504, 498, 503, 509, 502; 313/506, 507; 427/66, 69, 70

[56] References Cited

U.S. PATENT DOCUMENTS

| | | | |
|---|---|---|---|
| 4,356,429 | 10/1982 | Tang | 313/503 |
| 4,513,023 | 4/1985 | Wary | 427/54.1 |
| 4,539,507 | 9/1985 | Van Slyke et al. | 548/220 |
| 4,720,432 | 1/1988 | Van Slyke et al. | 428/457 |
| 4,730,146 | 3/1988 | Maser et al. | 313/511 |
| 4,779,166 | 10/1988 | Tanaka et al. | 362/31 |
| 5,015,748 | 5/1991 | Eida et al. | 556/143 |
| 5,041,582 | 8/1991 | Eida et al. | 556/144 |
| 5,055,739 | 10/1991 | Thioulouse | 313/509 |
| 5,093,691 | 3/1992 | Utsugi et al. | 357/4 |
| 5,121,029 | 6/1992 | Hosokawa et al. | 313/504 |
| 5,122,247 | 6/1992 | Kokado et al. | 264/181.1 |
| 5,126,214 | 6/1992 | Tokailin et al. | 313/504 |
| 5,130,603 | 7/1992 | Tokailin et al. | 428/696 |
| 5,142,343 | 8/1992 | Hosokawa et al. | 357/17 |
| 5,364,654 | 11/1994 | Hosokawa et al. | 313/504 |

FOREIGN PATENT DOCUMENTS

A-0398764 11/1990 European Pat. Off. .

*Primary Examiner*—Charles Nold
*Attorney, Agent, or Firm*—Frishauf, Holtz, Goodman, Langer & Chick, P.C.

[57] ABSTRACT

A thin film electroluminescence device and a process for production thereof. This device is characterized in that as a light emitting layer material or charge injection layer material, a polymer film having at least one of a light emitting layer function, a charge transport function and a charge injection function, and having a film thickness of not: more than 0.5 μm is prepared by the vacuum evaporation method and used.

13 Claims, No Drawings

THIN FILM ELECTROLUMINESCENCE DEVICE

This is a division of application Ser. No. 07/669,754 filed Mar. 15, 1991 now U.S. Pat. No. 5,443,921.

BACKGROUND OF THE INVENTION

1. Field of the Invention

The present invention relates to an organic thin film electroluminescence device and a process for production thereof, and more particularly to an organic thin film electroluminescence device having heat resistance and a long life and a process for producing an organic thin film electroluminescence device in which patterning can be conducted by photoetching.

2. Detailed Description of Related Arts

An electroluminescence device (hereinafter referred to as an "EL" device) is easily distinguished because it emits light, and is durable to impacts because it is a completely solid device. Recently various EL devices using inorganic or organic compounds in its light emitting layer have been proposed and have been attempted to be put into practical use. Of these, an organic thin film EL device can greatly decrease an applied voltage and, therefore, various materials have been developed therefor.

For example, an organic EL device comprising anode/triphenylamine derivative/light emitting layer/cathode as described in Japanese Patent Application Laid-Open No. 194393/1984 is excellent in low applied voltage, multicolor display, high brightness and high efficiency. However, a device in which 8-hydroxyquinone aluminum complex is used in the light emitting layer has an obstacle in its practical use, because its service life, when it is driven at a brightness of 50 cd/m$^2$, is about several hundred hours.

One of the causes is heat deterioration. The above 8-hydroxyquinone-aluminum complex is a compound having a relatively high heat resistance, but inevitably suffers from heat deterioration.

In recent years, various devices in which an organic low molecular weight vacuum deposited film is used as the light emitting layer have been produced. For example, an EL device comprising anode/styrylamine light emitting layer/charge injection layer/cathode is known (Appl. Phys. Lett., 55 (1989)1489). Many of the organic low molecular weight compounds to be used in the organic low molecular weight vacuum deposited film have melting points of 300° C. or lower and even in the form of amorphous film, its glass transition temperature is lower than 100° C. In any case, there is a problem of heat resistance, and heat deterioration inevitably occurs.

Although the behavior of the above heat deterioration has not been examined in detail yet, it is considered that crystallization and melting of the light emitting layer, enlargement of pinholes, peeling off of the light emitting layer and so forth, all caused by heat generation of the device due to Joule heat, are responsible for the heat deterioration.

Many light emitting layers using organic low molecular weight compounds are soluble in a solvent, and even if insoluble in a solvent, they are deteriorated by peeling off due to the solvent. Thus photoetching cannot be applied. Accordingly patterning is difficult, and this becomes an obstacle in production of displays and so forth in the form of EL device.

It is reported that a device in which a thin film is formed by applying polyvinyl carbazole by the casting method exhibits electroluminescence (Polymer, 24 (1983), 755). However, by the above method, it is quite difficult to obtain a thin and uniform film, and luminescence and film thickness in the above device are considered to be less than 1 cd/m$^2$ and more than several microns, respectively.

It is reported that a device in which a thin conjugated polymer film is used as a light emitting layer, said thin conjugated polymer film being formed by the following method. A precursor polymer film is formed by the spin-coating method and heated to form the thin conjugated polymer film (WO 90/13148). However, by the spin-coating method, it is quite difficult to obtain thin and pinholeless film less than 0.1 µm in thickness.

The light emitting device with large area uniform emission cannot be obtained by any of the above methods. In addition, the light emitting layer formed by the above method is contaminated with various impurities derived from a solution including the precursor polymer. The impurities easily diminish luminescence and efficiency of the EL device, and the device with high performance and long life cannot be obtained.

An EL device in which poly-silazane layer prepared by the spin-coating method in a solution of the polymer is used as a hole transporting layer is reported (U.S. Pat. No. 4,950,950). The electroluminescence device with high performance and long life cannot be obtained by any of the above methods because of the aforesaid defects.

SUMMARY OF THE INVENTION

The present inventors made investigations to develop an EL device which is simple in structure and excellent in heat resistance, and furthermore which permits high efficiency and long-term light emitting, and to develop a process for production of an EL device in which patterning is easy.

As a result, it has been found that an EL device having excellent heat resistance and long life can be obtained without deterioration of light emitting efficiency by using a polymer which is prepared by the vacuum evaporation method, preferably by the vacuum deposition polymerization method in which a monomer having a capability as a light emitting layer of electroluminescence is deposited by vacuum deposition, and then the monomer is polymerized to form thin emitting polymer film. Furthermore the patterning by photoetching can be attained by carrying out the polymerization according to a specified process.

The present invention relates to a thin film electroluminescence device in which as a light emitting layer material or a charge injection layer material, a polymer thin film having at least one function of a light emitting layer function, a charge transport function and a charge injection function, and having a film thickness of not more than 0.5 µm is formed by the vacuum evaporation method.

The present invention relates to a process for producing a thin film electroluminescence device in which, in the process of production of an organic thin film electroluminescence device by applying (1) a step of forming an electrode on a substrate, (2) a step of forming a charge transport layer, (3) a step of forming a light emitting layer and (4) a step of forming the opposite electrode, singly or repeatedly, as a step of forming a light emitting layer or charge transport layer having at least one of a charge injection function, a charge transport function and a light emitting layer function necessary for electroluminescence, a step comprising vacuum depositing a heat resistant polymer forming monomer source and then polymerizing the monomer to form the light emitting layer or the charge transportation layer is included.

DESCRIPTION OF THE PREFERRED EMBODIMENT

The light emitting layer in the EL device of the present invention has the following three functions. These functions are collectively called "light emitting layer function".

(1) Injection Function

Function which enables the injection of holes from an electrode or the hole injection layer, and the injection of electrons from an electrode or the electron injection layer, upon application of an electric field.

(2) Transport Function

Function which transports injected charges (electrons and positive holes) by the force of electric field.

(3) Light Emitting Function

Function which provides a field in which electrons and positive holes are recombined, and relates them to light emission.

Although there may be a difference between ease of injection of hole and that of electron, and there may be variations in the transport function represented by mobility of hole and electron, it is preferred that any one of the charges be transported.

The hole injection or transport layer in the EL device of the present invention has the hole injection function and the hole transport function. The electron injection or transport layer in the EL device of the present invention has the electron injection function and the electron transport function.

According to the present invention, an EL device having excellent heat resistance and long life can be obtained by using a polymer which is prepared by vacuum evaporation method, which enables to form a smooth, uniform, pinholeless and thin polymer film. Conventional vacuum evaporation methods cannot be adapted to the deposition of the polymer having heat resistance.

In the present invention, vacuum evaporation method is modified to the vacuum deposition polymerization method comprising deposition of a monomer having at least one of light emitting layer function, and polymerization of the monomer.

As the polymer thin film constituting the light emitting layer or charge injection layer of the organic thin film EL device of the present invention, various ones can be used. For example, polyimide represented by the general formula:

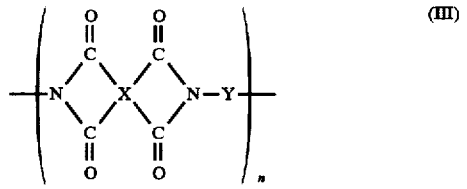

(III)

wherein X is an organic group containing an aromatic group, Y is an organic group having one of light emitting layer function (charge injection function, charge transport function and light emitting function), and n is an integer indicating a degree of polymerization, which is synthesized through polyamic acid (polyimide precursor) by reacting an acid dianhydride represented by the general formula:

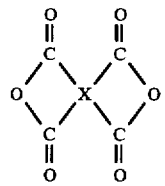

(I)

wherein X has the same meaning as defined above, with a diamino compound represented by the general formula:

$$H_2N-Y-NH_2$$ (II)

wherein Y has the same meanings as defined above, as heat resistant polymer-forming monomer sources by the vacuum depositing polymerization method, is preferably used.

X in the acid dianhydride represented by the general formula (I) is as defined above. Specific examples of are shown below.

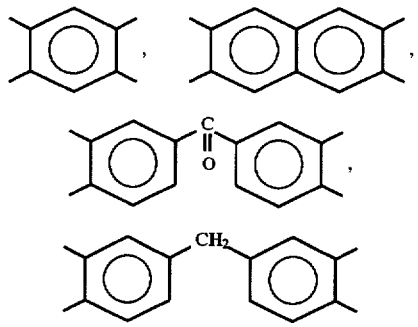

Various acid anhydrides which have been developed as the polyimide starting material can be used.

When the polymer thin film is used as the light emitting layer, Y in the compound represented by the general formula (II) is, as described above, an organic group having all the light emitting layer function of EL, particularly an organic low molecular compound radical. There are various organic low molecular compound radicals, including radicals of the known organic low molecular compounds having the EL light emitting layer function, e.g., polycyclic aromatic compound radicals such as anthracene, perylene and pyrene, fluorescent brightening agents described in Japanese Patent Application Laid-Open No. 194393/1984, metal chelated oxide compounds described in Japanese Patent Application Laid-Open No. 295695/1978, stilbene compounds described in Japanese Patent Application Laid-Open No. 160894/1990, particularly cumarin compounds, distyrylpyrazine compounds, and naphthalimide fluorescent compounds described in Jpn. Appl. Phys. 27 (1988) L713, etc. When the polymer thin film is used as the charge injection layer (including both the charge injection layer and the charge transport layer), Y in the compound of the general formula (II) is a radical comprising an organic low molecular compound having the positive hole injection transport function or the electron injection transport function. Examples are radicals comprising phthalocyanine, porphyrin and triphenylamine derivatives described in Japanese Patent Application Laid-Open No. 194393/1984, and radicals comprising oxadiazole derivatives having the electron injection transport function.

In the present invention, it is preferred that the highly heat resistant polyimide represented by the general formula (III) and having the organic EL function, as obtained by polymerizing the compound of the general formula (I) and the compound of the general formula (II) by the vacuum deposition polymerization method be used as the light emitting layer the charge transport layer.

Synthesis of polyimide by the above vacuum deposition polymerization method can be carried out by any of various known methods, for example, the methods described in Shinku, 28 (1985) 437, J. Vac. Sci. Technol., A4 (1986)369, and J. Vac. Sci. Tecnol., A5 (1987)2253.

More specifically, an acid dianhydride monomer represented by the general formula (I) and a diamino monomer represented by the general formula (II) are subjected to two components vacuum deposition in a vacuum vessel by heating their respective vacuum deposition sources, thereby forming polyamic acid on a substrate, and the polyamic acid is subjected to dehydration ring-closing by heating it in an inert gas atmosphere, thereby providing the polyimide of the general formula (III).

Conditions for the above vacuum deposition are chosen so that a boat heating temperature is 50° to 400° C., a degree fo vacuum is $10^{-5}$ to $10^{-3}$ Pa, a rate of vacuum deposition is 0.1 to 500 Å/sec, preferably 1 to 10 Å/sec, a substrate temperature is –50° to +300° C., preferably 0° to 50° C., and a film thickness is 5 nm to 0.5 µm. Heating of the vacuum deposition source can be carried out by direct heating, for example, by passing electricity through a vacuum deposition boat, or indirect heating, for example, by the use of a halogen lamp tube. Although the vacuum deposition temperature varies depending on the type of the monomer to be used, it is preferred to set so that the acid dianhydride monomer and the diamino monomer are evaporated at a ratio of 1:1. If any one of the two monomers is vacuum deposited excessively, the excessive monomer undesirably remains in the resulting polyimide. It is preferred, therefore, that the vacuum deposition sources be heated while feed back controlling to maintain the temperature at a predetermined temperature. The aforementioned conditions vary depending on the type of the compound, and the desired crystal structure, association structure., etc. of a molecular deposited film, and cannot be determined unconditionally. It is preferred, however, that the boat be heated at temperatures not causing decomposition of the compound.

The above dehydration ring closing treatment is preferably carried out by heating at a temperature of 100° to 400° C., particularly about 200° C. for at least 20 minutes. If the time of the treatment is too short, or the heating temperature is too low, polymerization proceeds only insufficiently and the polyamic acid remains. On the other hand, if the heating temperature is too high, for example, it is in the neighborhood of 500° C., the resulting polyimide is decomposed. When patterning is carried out by photoetching as will be described hereinafter, it is preferred that the polymerization be carried out at about 100° C. for at least 10 minutes. As an inert gas to be used as the atmosphere in practice of the dehydration ring closing treatment, it is preferred to use dry gas without moisture; for example, nitrogen, argon, helium or the like can be used.

Other vacuum deposition polymerization method can be used to prepare the heat resistance polymer thin film in the EL device of this invention. For example, in the other method, a photopolymerizing monomer having one of the light emitting layer function is deposited by vacuum evaporation, and then the monomer is polymerized under UV or visible light to form light emitting layer or charge injection layer.

It is important and preferred that the thickness of the light emitting layer or charge transport thin film as obtained by the polymerization be not more than 0.5 µm (may be not more than 0.1 µm). If the film thickness is more than 0.5 µm, the light emitting brightness is considerably decreased to not more than 10 cd/m²; in many cases, it cannot be visually confirmed in a bright room.

The light emitting layer or charge injection layer as produced by the vacuum deposition method is excellent in film thickness, is free from pinholes, and further in the case of the light emitting layer, satisfies the aforementioned required three functions including: injection, transport and light emitting, and further in the case of the charge transport layer, it satisfies the required charge injection and transport function.

Examples of heat resistance polymers which can be prepared as light emitting layers other than the above polyimide include polyamide, polyamidoimide, polyurea and polyazomethine (Nippon Kagakukai 54th Spring Meeting Prescript II, 1547 (1987), Polymer, Preprints, Japan, Vol. 136, 1475 (1987), and ibid., Vol. 36, 3021 (1987)).

For example, in the case of polyamide, a monomer represented by the general formula:

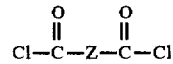

wherein Z is

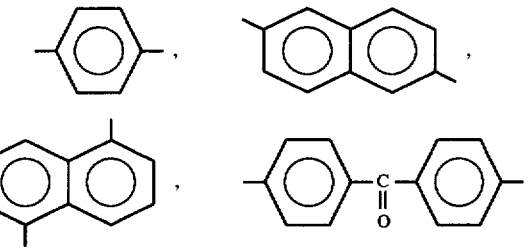

or the like is used. In the case of polyurea, for example, a monomer represented by the general formula:

wherein Z has the same meaning as above is used.

As described above, heat deterioration is one of the causes of deterioration of the organic EL Device. It is considered that the Joule heat of the device, for example, causes peeling-off of the light emitting layer, melting, enlargement of pinholes, end crystallization of device, resulting in unevenness of the film thickness. In the present invention, the heat deterioration can be prevented by using a highly heat resistant polymer having a decomposition temperature of at least 300° C., preferably at least 500° C. and a glass transition temperature of at least 200° C., preferably 300° to 400° C., such as polyimide obtained by the above vacuum deposition polymerization, and thus the heat deterioration of the organic EL device can be prevented.

A process for production of the organic thin film EL device will hereinafter be explained in the order of its steps.

A transparent substrate is preferably used. In general, glass, transparent plastics, quartz, etc. are used. This substrate is subjected to supersonic washing using isopropyl alcohol and, thereafter, preferably washed with UV ozone.

On the substrate, predetermined electrodes are formed by the vacuum deposition method or the sputtering method. As these electrodes (anode and cathode), transparent materials of metals such as gold, aluminum and indium, alloys, mixtures or indium tin oxide (mixed oxide of indium oxide and tin oxide, ITO), $SnO_2$, and ZnO are preferably used. As the anode, a metal or electrically conductive compound having a large work function is suitable, and as the cathode, a metal or electrically conductive compound having a small work function is suitable. It is preferred that at least one of these electrodes be transparent or translucent. The film thickness of the electrode is preferred to be 10 nm to 1 μm, specifically not more than 200 nm, to increase light transmittance.

A predetermined light emitting layer thin film is then formed by the aforementioned vacuum deposition polymerization method. On this light emitting layer, the opposite electrodes are formed in the same manner as above to obtain an EL device of a basic structure.

In the present invention, a desired pattern can be formed on the light emitting layer by carrying out the patterning treatment at an intermediate step without completely carrying out the above polymerization treatment.

In the case of the above polyimide light emitting layer, for example, the patterning treatment can be carried out according to the following steps.

(1) Prebake

A small amount of unreacted monomer, for example, is reacted to convert it into polyamic acid and hardened suitably, by applying heat in a dry nitrogen gas. At this time, the temperature should be within the range of 100° to 150° C. If the temperature is higher, than said 150° C. polyimidation occurs and etching becomes difficult.

(2) Coating of Positive Resist

A photoresist positive type is Coated on the polyamic acid film by the use of a spinner. The film thickness of the positive resist is preferably 0.5 to 2 μm.

(3) Resist Prebake

The photoresist film is heated in a dry nitrogen gas at a temperature of about 100° C. for about 30 minutes.

(4) Exposure

A photomask with a predetermined pattern is placed, and, ultraviolet ray exposure is applied. In connection with exposure conditions, suitable exposure intensity and time for the photoresist film are chosen.

(5) Developement, Matching

Exposed areas are removed with a developer, and the polyamic acid is etched. The developer is preferably a mixture of a hydrazine etchant and water. By choosing a suitable etching solution, even a nearly thoroughly polyimidezed film can be etched.

(6) Rinse Drying

The remaining etching solution is removed by rinsing with water, for example, and dried by blowing an inert gas, such as dry nitrogen gas or argon gas.

(7) Photoresist Peeling

The photoresist is peeled apart with a solvent, such as isobutyl acetate, and rinsed with isopropyl alcohol.

(8) Cure

The polyamic acid is subjected to dehydration and ring closing to convert into polyimide, by heating under the aforementioned conditions.

Various patterns can be formed on a light emitting layer by terminating vacuum deposition polymerization in the course thereof and then applying photoetching.

In connection with the laminate structure of the EL device, in the case of the aforementioned structure, i.e., electrode/light emitting layer/electrode, a charge injection layer (positive hole injection transport layer or an electron injection transport layer) can be placed between the light emitting layer and the electrode. When a charge injection layer comprising the conventional organic low molecular layer is used, it is preferred that the charge injection layer be provided after formation of the light emitting layer to produce an EL device having the structure of electrode/light emitting layer/charge injection layer/electrode. On the contrary, if the light emitting layer is formed after formation of the charge injection layer by vacuum deposition of the usual organic low molecular compound, the charge injection layer often melts or crystallizes at the time of polymerization treatment in the formation of the light emitting layer, particularly at the time of curing; in many cases, a thin film cannot be obtained. However, in the case of a charge injection layer of phthalocyanine or porphyrin having a high melting point a device having the above structure can be produced because the charge injection layer is durable to heat. Compounds described in Japanese Patent Application Laid-Open No. 220251/1988 among triphenylamine-based compounds have melting points as high as three hundred several ten degree centigrade and high glass transition temperature reaching 135° C. and, therefore, the charge injection layer can be formed before formation of the light emitting layer. Furthermore, if a polymer thin film according to the process of the present invention is used as charge transport layer (charge injection layer), no disturbance in film properties is caused at the time of formation of the light emitting layer.

Except for the case that the aforementioned organic low molecular layer is used as the charge injection layer, for example, in the case that an inorganic semiconductor is used as a charge injection layer, the order of production of the device is not critical. Inorganic semiconductors such as crystalline or amorphous Si, SiC, CdS, and ZnO as described in Japanese Patent Application Laid-Open Nos. 139893/1990, 196475/1990, 207488/1980, 312873/1989 and 312874/1989 are markedly high in heat resistance as compared with organic low molecular compounds. Thus even if the light emitting layer of the present invention is formed after an inorganic semiconductor layer is formed as the charge injection layer, the charge injection layer does not melt or crystallize even in the polymerization treatment at the time of formation of the light emitting layer.

In the EL device of the present invention, the light emitting performance is markedly increased by providing the above positive hole injection transport layer or electron injection transport layer. The hole injection transport layer (hole injection layer or hole transport layer; these two layers are not distinguished) comprises a hole transfer compound (hole injection material) and has a function which transfers holes injected from anode to the light emitting layer (i.e., hole injection function and hole transport function). When this layer is sandwiched between the anode and the light emitting layer of the EL device, more holes are injected into the light emitting layer at a low voltage and the brightness of the device is increased.

A hole transport compound of the positive hole injection transport layer as used herein is a compound which when it is placed between two electrodes to which a voltage is applied, and holes are injected from the anode, is capable of transferring suitably the holes to the light emitting layer. By sandwiching the hole injection transport layer between the anode and the light emitting layer, more holes are injected into the light emitting layer at lower electric fields. Moreover, electrons injected from the anode or the electron injection transport layer into the light emitting layer are accumulated in the vicinity of the interface in the light emitting layer by the barrier of electrons present in the interface between the light emitting layer and the hole layer, resulting in an increase in light emitting efficiency. Preferred hole transfer compounds, when a layer is placed between electrodes provided with an electric field of $10^4$ to $10^6$ V/cm, have a degree of imigration of hole of at least $10^{-6}$ cm$^2$/V.sec. Thus, various compounds used as hole transport material in photoconductive material are preferably used.

Examples of such charge transport materials are shown below.

(1) Triazole derivatives described in U.S. Pat. No. 3,112,197.

(2) Oxadiazole derivatives described in U.S. Pat. No. 3,189,447.

(3) Imidazole derivatives described in Japanese Patent Publication No. 16096/1962.

(4) Polyarylalkane derivatives described in U.S. Pat. Nos. 3,615,402, 3,820,989, 3,542,544, Japanese Patent Publication Nos. 555/1970, 10983/1976, and Japanese Patent Application Laid-Open Nos. 93224/1976, 17105/1980, 4148/1981, 108667/1980, 156953/1980, 36656/1981.

(5) Pyrazoline derivatives and pyrazolone derivatives described in U.S. Pat. Nos. 3,180,729, 4,278,746, and Japanese Patent Application Laid-Open Nos. 88064/1980, 88065/1980, 105537/1984, 51086/1980, 80051/1981, 88141/1981, 45545/1982, 112637/1979, 74546/1980.

(6) Phenylenediamine derivatives described in U.S. Pat. No. 3,615,404, Japanese Patent Publication Nos. 10105/1976, 3712/1971, 25336/1972, and Japanese Patent Application Laid-Open Nos. 53435/1979, 110536/1979, 119925/1979.

(7) Arylamine derivatives described in U.S. Pat. Nos. 3,567,450, 3,180,703, 3,240,597, 3,658,520, 4,232,103, 4,175,961, 4,012,376, Japanese Patent Publication Nos. 35702/1974, 27577/1964, Japanese Patent Application Laid-Open Nos. 144250/1980, 119132/1981, 22437/1981, and West German Patent No. 1,110,518.

(8) Amino-substituted chalocone derivatives described in U.S. Pat. No. 3,526,501.

(9) Oxazole derivatives described in U.S. Pat. No. 3,257,203.

(10) Styrylanthracene derivatives described in Japanese Patent Application. Laid-Open No. 46234/1981.

(11) Fluorenone derivatives described in Japanese Patent Application Laid-Open No. 110837/1979.

(12) Hydrazone derivatives described in U.S. Pat. 3,717,462, and Japanese Patent Application Laid-Open Nos. 59143/1979, 52063/1980, 52064/1980, 46760/1980, 85495/1980, 11350/1982, 148749/1982.

(13) Stilbene derivatives described in Japanese Patent Application Laid-Open Nos. 210363/1986, 228451/1986, 14642/1986, 72255/1986, 47646/1987, 36674/1987, 10652/1987, 30255/1987, 93445/1985, 94462/1985, 174749/1985, 175052/1985.

Particularly preferred examples are compounds (aromatic tertiary amines) as a hole transport layer as disclosed in Japanese Patent Application Laid-Open No. 295695/1988, and compounds (porphyrin compounds) as a hole injection layer.

Particularly preferred examples of hole transfer compounds are disclosed in Japanese Patent Application Laid-Open Nos. 27033/1978, 58445/1979, 149634/1979, 64299/1979, 79450/1980, 144250/1980, 119132/1981, 295558/1986, 98353/1986, and U.S. Pat. No. 4,127,412.

Examples are shown below.

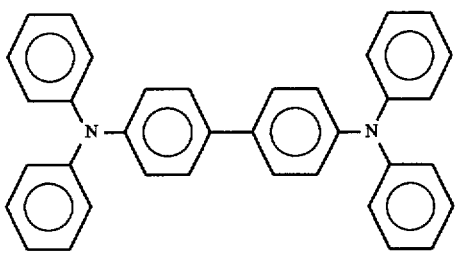

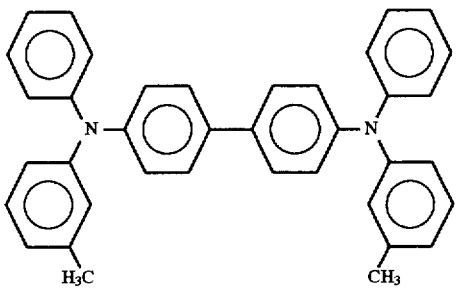

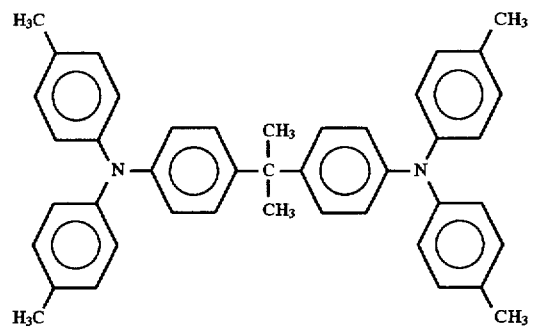

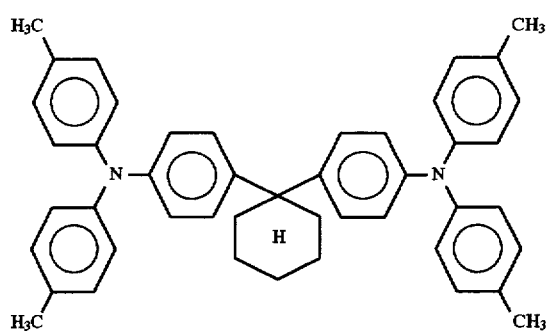

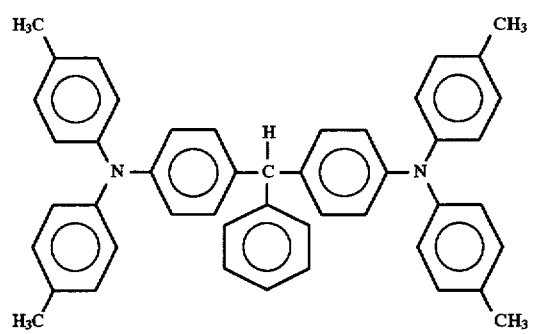

-continued

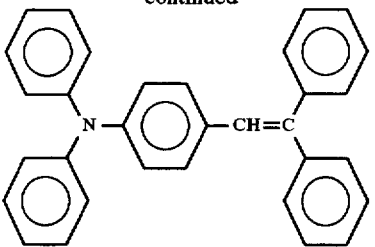

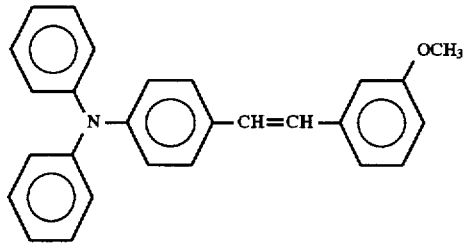

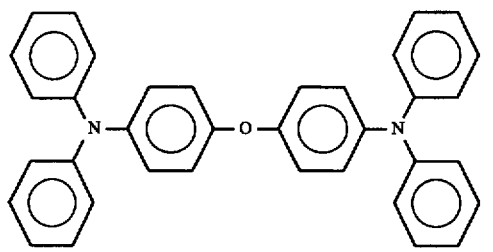

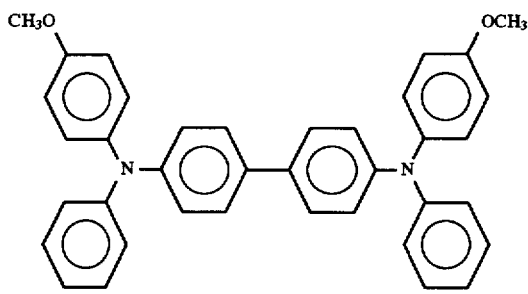

Using these hole transfer compounds, the hole injection transport layer is formed. This hole injection transport layer may be a single layer, or this single layer and a hole injection transport layer of other compound may be laminated. In one of the present invention, if a low molecular weight compound having a hole injection transport function is used as the radical Y of the general formula (III), a polymer thin film can be a hole injection transport layer.

On the other hand, the electron injection transport layer (electron injection layer) comprises a compound having a function which transfers electrons (called an electron injection function or an electron transfer function, which are not distinguished). Preferred examples of electron transfer compounds (electron injection materials) forming the electron injection transport layer are shown below.

(1) Nitro-substituted fluorenone derivatives, e.g.,

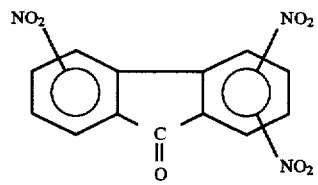

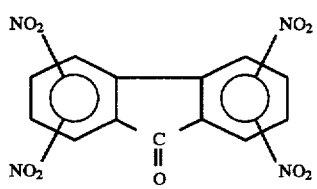

(2) Anthraquinodimethane derivatives described in Japanese Patent Application Laid-Open Nos. 149259/1982, 55450/1983, 104061/1988.

(3) Diphenylquinone derivatives, e.g.,

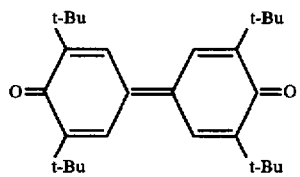

as described in Polymer Preprints, Japan Vol. 37, No. 3 (1968), p. 681.

(4) Thiopyrandioxide derivatives, e.g.,

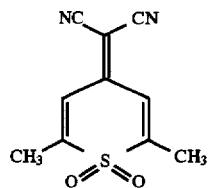

(5) Compounds represented by

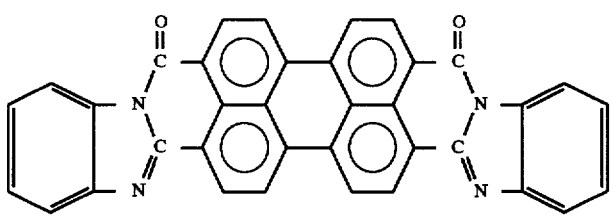

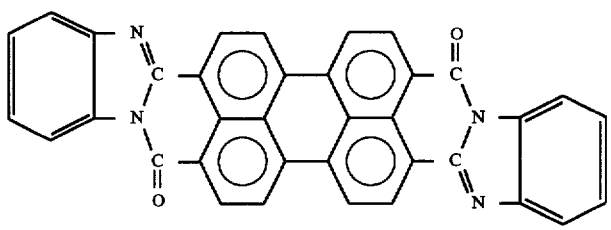

as described in J. J. Appl. Phys., 27, L 269 (1988).

(6) Fluorenylidene methane derivatives described in Japanese Patent Application Laid-Open Nos. 69657/1985, 143764/1986, 148159/1986.

(7) Anthraquinodimethane derivatives and anthrone derivatives described in Japanese Patent Application Laid-Open Nos. 225151/1986, 233750/1986.

(8) Oxadiazole derivatives represented by the formula:

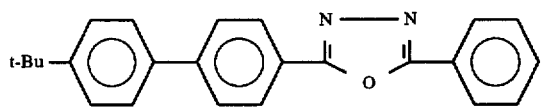

As described above, in the present invention, if a low molecular compound having an electron injection function is used as the radical Y, a polymer thin film can be an electron injection transport layer.

In the EL device of the present invention, in the case that applied voltage is alternating current (alternating driving), light emitting is observed only in the bias condition that plus voltage is applied to the anode side. In the case that applied voltage is direct current (direct driving), light emitting is always observed by applying plus voltage to the anode side.

In the organic EL device of the present invention, since the light emitting layer has high heat resistance as compared with those of the conventional EL devices, heat deterioration is inhibited and the service life of the EL device can be made longer. In accordance with the process of the present invention, patterning of the light emitting layer which has been difficult so far can be realized, and an EL device with a light emitting layer having various patterns can be produced by photoetching.

Thus cheap and stable products can be provided as EL devices for display of various equipment.

The present invention is described in greater detail with reference to the following examples.

EXAMPLE 1

(Preparation of Monomer having EL Light Emitting Layer Function)

A compound represented by the formula:

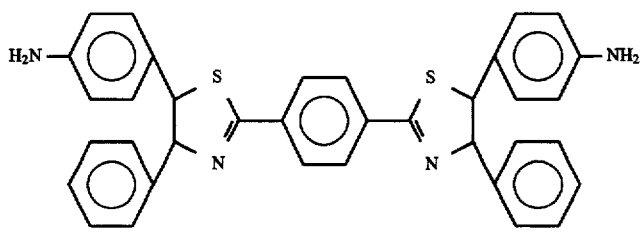

was synthesized according to Polymer Preprints, Japan 37 (1988) 770 and Polymer Preprints, Japan 38 (1989) 447, and purified by recyrstallizing from benzene. The melting point of this compound was 301°–305° C.

(Vacuum Deposition Polymerization of Light Emitting Layer)

500 mg of the above monomer was placed as one vacuum deposition source in a vacuum deposition apparatus, and as the other vacuum deposition source, commercially available pyromellitic dianhydride (produced by Aldrich Co., Ltd.) having the following formula:

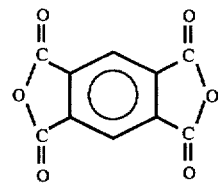

was placed.

As a substrate, a white plate glass with 1,000 Å ITO (produced by HOYA Co., Ltd.) was washed with isopropyl alcohol, dried by blowing dry nitrogen gas, and washed with UV ozone.

This substrate was maintained at room temperature, and the above vacuum deposition sources were heated with a halogen lamp at the same time and controlled so that each was evaporated at a rate of 4 Å/sec. Attention was paid so as to maintain the vacuum deposition speed constant, and when the thickness of the vacuum deposited film on the substrate reached 600 Å (measured by a quartz vibrator type film thickness meter), vacuum deposition was stopped.

The sample taken out of the vacuum chamber was heated (cured) at 200° C. for 40 minutes in an oven in a dry nitrogen atmosphere to complete vacuum deposition polymerization.

(Confirmation of Formation of Polyimide)

A vacuum deposition polymerization film having a thickness of 2 μm was formed in the same manner as above except that NaCl single crystal was used as a substrate.

An IR spectral analysis of the sample showed that absorption peaks ascribable to the imide bond were observed at 1780 cm$^{-1}$, 1720 cm$^{-1}$ and 1380 cm$^{-1}$. These peaks appeared after curing. This confirmed that polyimide was formed by curing. Peaks (in the vicinity of 1790 cm$^{-1}$, 1850 cm$^{-1}$) of the acid anhydride present before the curing suggested the remaining monomer. These peaks, however, disappeared after the curing. In order to confirmed the heat resistance of the film, DSC and TGA were carried out. DSC showed that the glass transition point was 340° C., and TGA showed that the decomposition temperature was 480° C. These confirmed that the film was highly heat resistant.

(Production of EL Device and Confirmation of Light Emitting)

On the above light emitting layer formed on the glass substrate, a Mg: In electrode was vacuum deposited. The vacuum deposition speed of Mg was set at 30 Å/sec, and the rate of vacuum deposition of In was set at 3–4 Å/sec.

With the ITO electrode as positive and the Mg: In electrode as negative, a direct voltage of 9 V was applied, and EL light emitting was confirmed.

EXAMPLE 2

(Synthesis of Positive Hole Injection Layer Material)
A triphenylamine having the following formula:

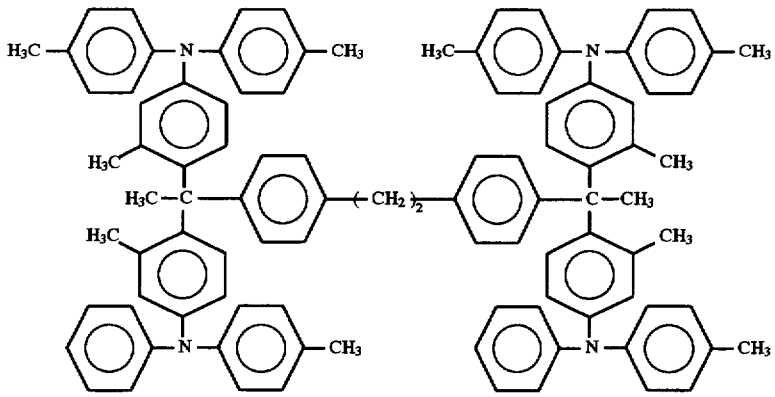

having a high glass transition temperature and a melting point of 323° C. was synthesized according to Preparation Example IV of Japanese Patent Application Laid-Open No. 220251/1988.

A white solid of m/e=1322 (M$^+$) of FD mass spectrum was purified with silica gel and then isolated. The melting point was 323°–324.5° C.

(Production of EL Device and Confirmation of Light Emitting)

500 mg of the above triphenylamine was placed in a vacuum deposition boat made of molybdenum, and by passing electricity therethrough, it was vacuum deposited in 700 Å on the same substrate as used in Example 1. Noteover, in the same manner as in Example 1, a polyimide light emitting layer was formed in 650 Å. In order not to break the from condition of the positive hole injection layer comprising the triphenylamine derivative as a thin film, curing was performed at 150° C. for 10 hours. Moreover, in the same manner as in Example 1, a Mg: In electrode was formed to produce a device.

By passing electricity through the device in the same manner as in Example 1, it was confirmed that the bluish green light brightness reached 200 cd/m$^2$. At this time, a current density was 15 mA/cm$^2$, an applied voltage was 5 V, and a light emitting efficiency was 0.84 lm/W. This device was subjected to a service life test in dry argon with the initial brightness of 100 cd/m$^2$. After light emitting for about 2,700 hours, the brightness dropped to ½ the original brightness. This service life was much greater than those of the conventional devices.

EXAMPLE 3

(Formation of Positive Hole Injection Transport Layer)
(Synthesis of Triphenylamine Derivative)

A diaminotriphenylamine derivative having the following formula:

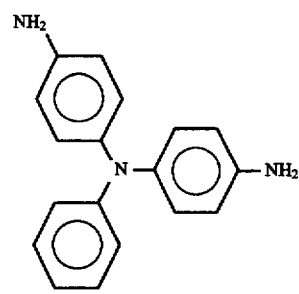

was synthesized by the usual method. First, 3,3'-dinitrotriphenylamine was synthesized according to Bull. Soc. Jpn. 59 (1986) 803. This compound can be synthesized also from aniline and p-fluoronitrobenzene according to the Ulman condensation method. The melting point of the compound was 145°–146° C.

Then this compound was reduced by the known reduction method using iron hydrochloride to obtain 3,3'-diaminotriphenylamine.

(Formation by Polymerization of Charge Transport Layer (Hole Injection Layer))

500 g of the monomer (3,3'-diaminotriphenylamine) obtained above was placed as one vacuum deposition source in a vacuum deposition apparatus. As the other vacuum deposition source, 2 g of commercially available terephthalic acid chloride was placed.

A 1,000 Å ITO white glass substrate washed in the same manner as in Example I was maintained at room temperature, and the vacuum vessel was evacuated to $10^{-6}$ Torr. Terephthalic acid chloride of the above vacuum deposition sources was heated with a halogen lamp, and it was confirmed that the degree of vacuum was $10^{-4}$ Torr. At this time, the vacuum deposition source containing the above triphenylamine derivative (3,3'-diaminotriphenylamine) was heated until the rate of vacuum deposition speed reached 4 Å/sec. When a quartz vibrator type film thickness meter on the substrate indicated 700 Å, vacuum deposition polymerization was stopped.

The polymer thin film thus formed was peeled apart and an absorption peak (in the vicinity of 1650 cm$^{-1}$) of the amide group was confirmed by the KBr pellet method. In this manner a polyamide thin film containing triphenylamine in the structure thereof was formed.

EXAMPLE 4

(Production of EL Device)

In the same manner as in Example 3, a polyamide thin film as a positive hole injection transport layer was formed. Then an Al(Ox)3 (Ox: oxine) complex layer was formed by the vacuum deposition method (film thickness 600 Å).

Moreover a Mg: Cu electrode was formed by the vacuum deposition method. Upon application of direct voltage of 8 V with ITO as an anode and the Mg$^+$Cu electrode as a cathode, a current of 50 mA/cm$^2$ passed, and green light (yellowish) emitting brightness with 1,300 cd/m$^2$ was obtained.

By Examples 3 and 4, it was confirmed that a charge transport layer can be formed by the vacuum deposition polymerization method.

What is claimed is:

1. A thin film electroluminescence device comprising an anode, a cathode and a charge injection layer disposed between said anode and said cathode, said charge injection layer being smooth, uniform and pinholeless and consisting essentially of a heat resistant polymer thin film having groups with a charge injection layer function as repeating units, said polymer thin film having a thickness of not more than 0.5 μm, and said polymer thin film being prepared by a vacuum evaporation polymerization method.

2. The device as claimed in claim 1, wherein the polymer thin film is made from a polymer selected from the group consisting of polyimide, polyamide, polyamidoimide, polyurea and polyazomethine.

3. The device as claimed in claim 1, wherein the polymer thin film has a decomposition temperature of at least 300° C. and a glass transition temperature of at least 200° C.

4. The device as claimed in claim 2, wherein the polymer is a polyimide of the formula:

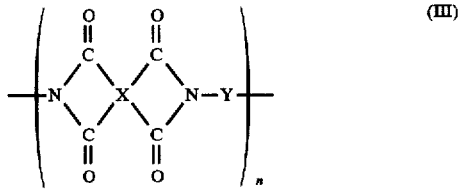

wherein X is an organic group containing an aromatic group; Y is an organic compound radical having a charge injection function which is capable of injecting positive holes or electrons when said Y is interposed between an anode and a cathode upon application of an electric field and n is an integer indicating a degree of polymerization.

5. The device as claimed in claim 4, wherein said Y is selected from the group consisting of phthalocyamine compounds, porphyrin compounds, triphenylamine compounds and oxadizole compounds.

6. The device as claimed in claim 4, wherein said X is selected from the group consisting of

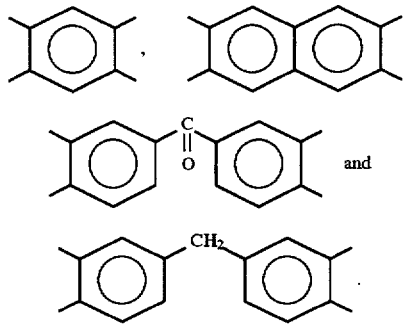

7. A thin film electroluminescence device comprising an anode, a cathode and a charge transport layer disposed between said anode and said cathode, said charge transport layer being smooth, uniform and pinholeless and consisting essentially of a heat resistant polymer thin film having groups with a charge transport layer function as repeating units, said polymer thin film having a thickness of not more than 0.5 μm and said polymer thin film being prepared by a vacuum evaporation polymerization method.

8. The device as claimed in claim 7, wherein the polymer thin film is made from a polymer selected from the group consisting of polyimide, polyamide, polyamidoimide, polyurea and polyazomethine.

9. The device as claimed in claim 8, wherein the polymer is a polyimide of the formula:

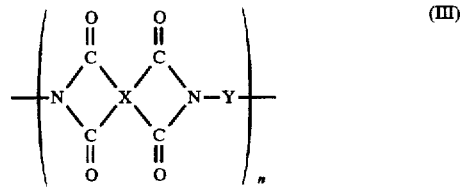

wherein X is an organic group containing an aromatic group; Y is an organic compound radical having a charge transport function which is capable if having transposed therein positive holes or electrons when said Y is interposed between an anode and a cathode upon application of an electric field and n is an integer indicating a degree of polymerization.

10. The device as claimed in claim 9, wherein said Y is selected from the group consisting of phthalocyanine compounds, porphyrin compounds, triphenylamine compounds and oxadizole compounds.

11. The device as claimed in claim 7, wherein the polymer thin film has a decomposition temperature of at least 300° C. and a glass transition temperature of at least 200° C.

12. A process for producing an organic thin film electroluminescence device which comprises:

(a) forming a first electrode an a substrate, (b) forming a charge injection layer on said substrate, (c) forming a light emitting layer on said substrate, said light emitting layer having a light emitting function necessary for electroluminescence and (d) forming a second electrode on said substrate, said second electrode being opposite to said first electrode, said charge injection layer and said light emitting layer being disposed between said first electrode and said second electrode, wherein the forming of said charge injection layer is carried out by vacuum depositing a heat resistant polymer forming monomer and then polymerizing the monomer.

13. A process for producing an organic thin film electroluminescence device which comprises:

(a) forming a first electrode on a substrate, (b) forming a charge transport layer on said substrate, (c) forming a light emitting layer on said substrate, said light emitting layer having a light emitting function necessary for electroluminescence and (d) forming a second electrode on said substrate, said second electrode which is being opposite to said first electrode, said charge transport layer and said light emitting layer being disposed between said first electrode and said second electrode, wherein the forming of said charge transport layer is carried out by vacuum depositing a heat resistant polymer forming monomer and then polymerizing the monomer.

* * * * *

UNITED STATES PATENT AND TRADEMARK OFFICE
CERTIFICATE OF CORRECTION

PATENT NO. : 5,705,284
DATED : January 6, 1998
INVENTOR(S) : HOSOKAWA et al

It is certified that error appears in the above-identified patent and that said Letters Patent is hereby corrected as shown below:

Title Page, right column, delete the ABSTRACT in entirety and replace with

--A thin film electroluminescence device comprising a charge injection layer. The charge injection layer comprises a polymer thin film having a charge injection function, and has a thickness of not more than 0.5 $\mu$m. The polymer thin film is prepared by a vacuum evaporation method.--

Signed and Sealed this

Twenty-ninth Day of February, 2000

Attest:

Q. TODD DICKINSON

*Attesting Officer*　　　*Commissioner of Patents and Trademarks*